US010205473B2

(12) United States Patent
Gu et al.

(10) Patent No.: US 10,205,473 B2
(45) Date of Patent: Feb. 12, 2019

(54) CARTESIAN ERROR-FEEDBACK TRANSMITTER ARCHITECTURE WITH A FEEDFORWARD PATH

(71) Applicant: The Regents of the University of California, Oakland, CA (US)

(72) Inventors: Qun Gu, Davis, CA (US); Jinbo Li, Davis, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/828,031

(22) Filed: Nov. 30, 2017

(65) Prior Publication Data

US 2019/0020366 A1    Jan. 17, 2019

Related U.S. Application Data

(60) Provisional application No. 62/428,368, filed on Nov. 30, 2016.

(51) Int. Cl.
*H04B 1/62* (2006.01)
*H04B 1/04* (2006.01)
(Continued)

(52) U.S. Cl.
CPC .......... *H04B 1/0475* (2013.01); *H04B 1/40* (2013.01); *H04B 2001/0433* (2013.01);
(Continued)

(58) Field of Classification Search
CPC .......... H04B 1/0475; H04B 1/40; H04B 2001/0433; H04B 2001/0441; H04L 27/2615; H04L 27/366; H04L 27/3411
(Continued)

(56) References Cited

U.S. PATENT DOCUMENTS 4,276,514 A * 6/1981 Huang ............... H03F 1/345
                                                    330/109
4,441,083 A * 4/1984 Akagiri ............. H03G 9/025
                                                    330/149
(Continued)

OTHER PUBLICATIONS

Passive Interferometer for Wideband and Linear Transmitter Leakage Cancellation by Jinbo Li, Ran Shu, and Qun Jane Gu published on Feb. 2015.*

*Primary Examiner* — Siu Lee
(74) *Attorney, Agent, or Firm* — Park, Vaughan, Fleming & Dowler LLP

(57) ABSTRACT

An error-feedback transmitter includes an input that receives an input signal, and an output that produces an output signal. It also includes an amplifier, located on a main path that carries a main signal between the input and the output. The transmitter includes a feedback path that carries a feedback signal from the output to the input, and a feedback-signal combiner, located on the main path between the input and the amplifier. The feedback-signal combiner negatively combines the feedback signal with the input signal to improve linearity in the output signal. The transmitter includes a feedforward path that carries a feedforward signal from the input toward the output, and a feedforward-signal combiner, located on the feedback path between the output and the feedback-signal combiner. The feedforward-signal combiner negatively combines the feedforward signal with the feedback signal to suppress components of the main signal in the feedback signal.

20 Claims, 13 Drawing Sheets

(51) Int. Cl.
H04L 27/36    (2006.01)
H04B 1/40     (2015.01)
H04L 27/34    (2006.01)
H04L 27/26    (2006.01)

(52) U.S. Cl.
CPC .. *H04B 2001/0441* (2013.01); *H04L 27/2615* (2013.01); *H04L 27/3411* (2013.01); *H04L 27/366* (2013.01)

(58) Field of Classification Search
USPC .................................... 375/295, 296, 297
See application file for complete search history.

(56) References Cited

U.S. PATENT DOCUMENTS

| | | | |
|---|---|---|---|
| 5,369,404 A * | 11/1994 | Galton ................. | H03D 3/241 341/143 |
| 7,702,301 B2 * | 4/2010 | Rabjohn ............... | H03F 1/3247 330/110 |
| 9,887,728 B2 * | 2/2018 | Jain ..................... | H04B 1/525 |
| 2015/0063828 A1 * | 3/2015 | Bliss ................... | H04B 10/25 398/189 |

* cited by examiner

CARTESIAN ERROR-FEEDBACK TRANSMITTER ARCHITECTURE WITH A FEEDFORWARD PATH

CROSS-REFERENCE TO RELATED APPLICATION

This application claims the benefit of U.S. Provisional Patent Application Ser. No. 62/428,368, entitled "Passive Wideband Interferometer Enabled High Spectral Purity Error-Feedback Transmitter," by inventor Qun Gu, filed on 30 Nov. 2016, the contents of which are incorporated by reference herein.

GOVERNMENT LICENSE RIGHTS

This invention was made with U.S. government support by the Office of Naval Research under contract number N00014-14-1-0257. The U.S. government has certain rights in the invention.

BACKGROUND

Field

The disclosed embodiments generally relate to the design of high-speed transmitters to facilitate wireless communication. More specifically, the disclosed embodiments relate to the design of a low-noise Cartesian error-feedback transmitter with a feedforward path, which is used to improve a tradeoff between linearity and noise.

Related Art

Increasing data rates in wireless communication systems are making it necessary to use the available spectrum more efficiently. This can be achieved through complex modulation schemes, such as orthogonal frequency-division multiplexing (OFDM) modulation. However, these complex modulation schemes require higher signal peak-to-average power ratios (PAPRs) to operate effectively. This need for higher PAPRs imposes more stringent linearity requirements on power amplifiers (PAs) in wireless transmitters. For this reason, Cartesian feedback loops are often used to "linearize" PAs in wireless transmitters. A Cartesian feedback loop operates by detecting a signal at the output of a PA and generating a negative feedback signal, which is fed back into the input of the PA to mitigate output noise and nonlinearities. Cartesian feedback loops have the advantage of not requiring any prior knowledge of the PA, and also exhibit robustness to unpredicted factors, such as process, voltage and temperature variations and aging effects.

However, the power of the signal at the PA output is typically quite large, so the feedback network that carries the feedback signal needs to be very linear. In fact, if system designers are not careful, it is possible for the nonlinearity of the feedback network to dominate the nonlinearity of the main transmission path. To reduce the nonlinearity in the feedback path, the feedback signal can be attenuated, which lessens the nonlinearity of the feedback network.

However, this gives rise to a tradeoff between linearity and noise, which can potentially constrain the performance of such wireless transmitters. As the linearity requirements for wireless transmitters increase, a larger attenuation is required to lessen the nonlinearity caused by the feedback network. However, increasing the attenuation of the feedback signal leads to more noise at transmitter output. Moreover, additional gain is needed on the main path to compensate for the increased attenuation to maintain a constant loop gain, which further increases transmitter noise.

Hence, what is needed is a technique for improving the tradeoff between linearity and noise in wireless transmitters without the limitations of existing techniques.

SUMMARY

The disclosed embodiments relate to the design of an error-feedback transmitter. This transmitter includes an input that receives an input signal, and an output that produces an output signal it also includes an amplifier, which is located on a main path that carries a main signal between the input and the output. The transmitter also includes a feedback path that carries a feedback signal from the output back to the input, and a feedback-signal combiner, which is located on the main path between the input and the amplifier. The feedback-signal combiner negatively combines the feedback signal with the input signal to improve linearity in the output signal. The transmitter also includes a feedforward path that carries a feedforward signal from the input toward the output, and a feedforward-signal combiner, which is located on the feedback path between the output and the feedback-signal combiner. The feedforward-signal combiner negatively combines the feedforward signal with the feedback signal to suppress components of the main signal in the feedback signal.

In some embodiments, the feedforward-signal combiner comprises a passive wideband interferometer.

In some embodiments, the feedforward-signal combiner and the feedforward path are designed so that when the feedback and feedforward signals are combined, the feedback and feedforward signals are out of phase and have similar magnitudes, whereby the components of the main signal are substantially eliminated from the feedback signal.

In some embodiments, the input signal is a modulated signal and the output signal is also a modulated signal.

In some embodiments, the input signal is a baseband signal and the output signal is a modulated signal. In these embodiments, the error-feedback transmitter further comprises: an upconverter mixer for the main signal, which is located on the main path between the feedback-signal combiner and the amplifier; a downconverter mixer for the feedback signal, which is located on the feedback path between the feedforward signal combiner and the feedback-signal combiner; and an upconverter mixer for the feedforward signal, which is located on the feedforward path between the input and the feedforward-signal combiner.

In some embodiments, the input comprises two inputs $X_I$ and $X_Q$ that carry separate quadrature components for a quadrature amplitude modulation (QAM) encoding scheme. In these embodiments, the main path includes separate paths for the two inputs $X_I$ and $X_Q$ that feed through two separate feedback-signal combiners and two separate upconverter mixers before being combined into a single input signal that passes through the amplifier. Also, the feedback path splits after the feedforward-signal combiner to form two separate feedback paths associated with the separate quadrature components, which feed through two separate downconverter mixers before feeding into the two separate feedback-signal combiners on the main path. Finally, the feedforward path includes separate paths for the two inputs $X_I$ and $X_Q$ that feed through two separate upconverter mixers before being combined into a single feedforward signal that feeds into the feedforward-signal combiner.

In some embodiments, the main path includes a low-pass filter for the main signal, which is located on the main path between the feedback-signal combiner and the upconverter for the main signal.

In some embodiments, the feedback path includes a low-pass filter for the feedback signal, which is located on the feedback path between the feedback-signal combiner and a driver for the feedback signal.

In some embodiments, the feedforward path includes a low-pass filter for the feedforward signal, which is located on the feedforward path between the input and the upconverter for the feedforward signal.

In some embodiments, the error-feedback transmitter also includes an attenuator, which is located on the feedback path between the output and the feedforward-signal combiner, and which has an attenuation parameter $\alpha$.

In some embodiments, the error-feedback transmitter also includes an antenna, which is coupled to the output.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Cartesian Error-Feedback Architecture

Figure 1A:
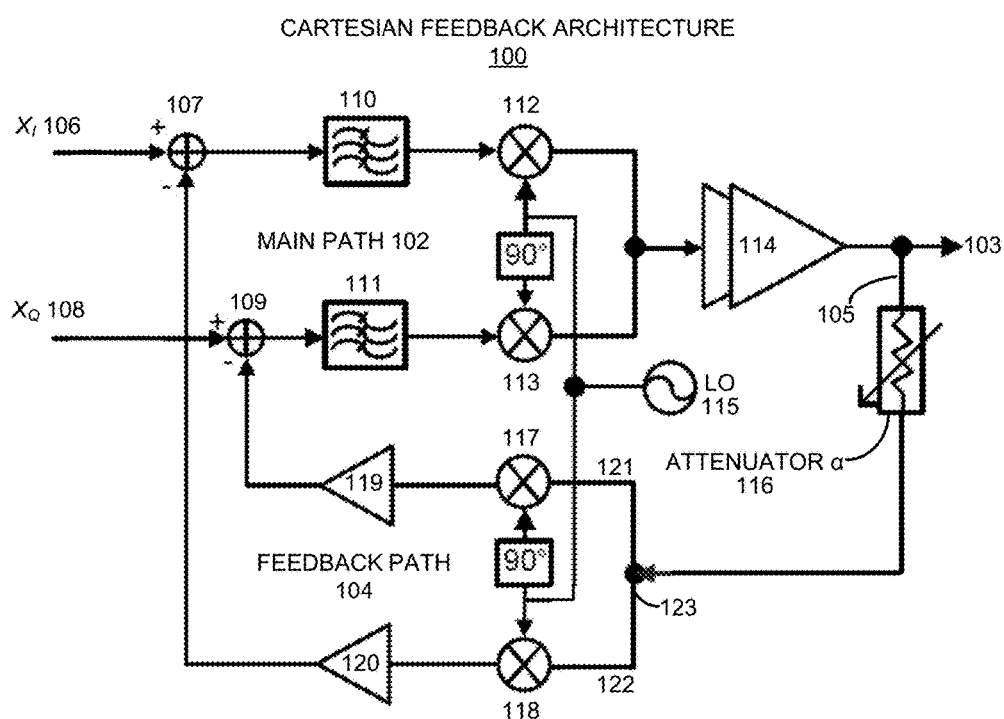
FIG. 1A illustrates a conventional Cartesian feedback architecture.

To resolve the above-described linearity-to-noise tradeoff in conventional Cartesian feedback loops, a modified Cartesian feedback loop architecture has been developed, which is called the "Cartesian error-feedback architecture." Before describing this new architecture, the conventional Cartesian feedback architecture 100 is described as is illustrated in FIG. 1A. This conventional Cartesian feedback architecture 100 comprises a main path 102 through an amplifier 114, and a feedback path 104.

More specifically, main path 102 includes separate paths for two inputs $X_I$ 106 and $X_Q$ 108 that carry separate quadrature components for a QAM encoding scheme. While on main path 102, input signals $X_I$ 106 and $X_Q$ 108 feed through two separate feedback-signal combiners 107 and 109, two separate low-pass filters 110-111, and two separate upconverter mixers 112-113, before being combined into a single signal that passes through the amplifier 114 to produce output 103.

In contrast, feedback path 104 carries a feedback signal 105 from output 103 back toward inputs $X_I$ 106 and $X_Q$ 108. Feedback signal 105 first feeds through an attenuator 116 and then a splitter 123, which splits feedback signal 105 to produce two separate feedback signals 121-122 associated with the separate quadrature components, which feed through two separate downconverter mixers 117-118 and two separate drivers 119-120 before feeding into the two separate feedback-signal combiners 107 and 109 located on the main path 102. During operation of Cartesian feedback architecture 100, feedback-signal combiners 107 and 109 negatively combine their feedback signals with input signals $X_I$ 106 and $X_Q$ 108 to improve linearity in output signal 103.

Figure 1B:
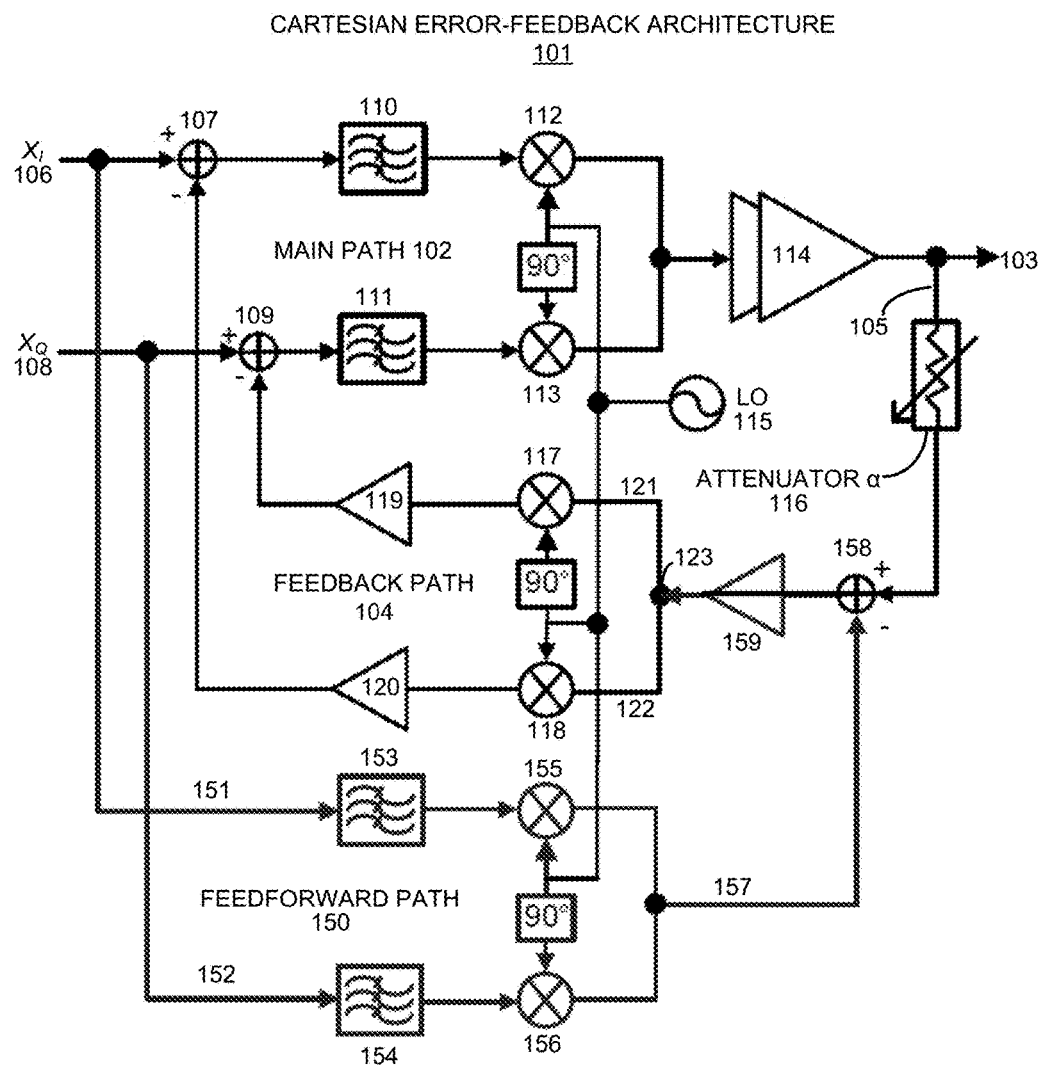
FIG. 1B illustrates a Cartesian error-feedback architecture in accordance with the disclosed embodiments.

The new "Cartesian error-feedback architecture" 101 illustrated in FIG. 1B introduces an extra feedforward path 150 into the conventional Cartesian feedback architecture 100 illustrated in FIG. 1A. More specifically, feedforward path 150 carries two separate feedforward signals 151-152 from the two inputs $X_I$ and $X_Q$ 106 and 108, which feed through two separate low-pass filters 153-154, and two separate upconverter mixers 155-156, before being combined into a single feedforward signal 157, which feeds into a feedforward-signal combiner 158. Note that feedforward-signal combiner 158 is located on the feedforward path 150 between attenuator 116 and a buffer 159 that feeds into splitter 123. During operation of Cartesian error-feedback architecture 101, feedforward-signal combiner 158 negatively combines the feedforward signal 157 with the feedback signal 105 to suppress components of the main signal in feedback signal 105. Hence, the resulting feedback signal 105 primarily includes distortion components, which when negatively combined with input signals $X_I$ 106 and $X_Q$ 108, does a better job of improving the linearity of output signal 103 than an unmodified feedback signal.

We next analyze this improvement in linearity through both analytical models and simulations. However, before doing so, some terminology, notations and assumptions are first discussed.

Terminology Notations and Assumptions

This section discusses terminology, notations and assumptions used in this disclosure.

G, $\alpha$, $\beta$ and $\gamma$ represent the main path gain, coupling coefficient (or equivalently the inverse of the attenuation ratio), the feedback path gain and the feedforward path gain, respectively, in voltage units. (Unless defined otherwise, all gain symbols mentioned in this disclosure are in voltage units.) The transmitter signal gain is represented as $G_{SIG}$, which has to be large enough not to degrade the PA efficiency. The following analysis targets $G_{SIG} > 20$ dB.

The loop gain $G\alpha\beta$ is given by the symbol T. Because the loop gain is directly linked with the suppression of nonlinearities of the amplifier, a higher loop gain is generally preferred; assume T=20 dB.

$P_{OUT}$ is used to represent the output power. Maximum $P_{OUT}$ is 21 dBm according to the requirements of wideband code division multiple access (WCDMA) power class 4. The output-related main path nonlinearities, input-related feedback path nonlinearities and output-related feedforward path nonlinearities are represented as $e_{MP}$, $e_{FB}$ and $e_{FF}$, respectively. Their corresponding contributions to the system output are $e_{OUT,MP}$, $e_{OUT,FB}$ and $e_{OUT,FF}$, respectively. For simplicity, the $3^{rd}$-order intercept point (IP3) will be used to characterize nonlinearities. $OIP3_{MP}$, $IIP3_{FB}$ and $OIP3_{FF}$ are used to indicate the output-related, input-related and output-related IP3s of the main path, feedback path and feedforward path, respectively. $OIP3_{MP}$ is assumed to be 31 dBm, which is 10 dB higher than $P_{OUT}$. Because the feedback path acts similarly to a normal receiver, $IIP3_{FB}$ is set to be −8 dBm. Considering that the amplifier in the main path typically constrains the entire transmitter's linearity, the linearity criteria for the feedback path and feedforward path are set to be $e_{OUT,FB} < e_{OUT,MP}$ and $e_{OUT,FF} < e_{OUT,MP}$, respectively.

The input-related noise of the main path, feedback path and feedforward path are denoted as $N_{MP}$, $N_{FB}$ and $N_{FF}$, respectively, and their contributions to the output are $N_{OUT,MP}$, $N_{OUT,FB}$ and $N_{OUT,FF}$, respectively. Note that the output noise sum $N_{OUT}$ needs to be below −154 dBc/Hz at a 45 MHz offset to ensure the receiver's noise figure degradation is less than 0.5 dB.

Linearity Versus Noise Tradeoff in Conventional Cartesian Feedback Loops

For a conventional Cartesian feedback loop, the system output Y is related to the system input X through the following equation $$Y = \frac{GX}{1+\alpha\beta G} \approx \frac{1}{\alpha\beta} \text{ when } G\alpha\beta \gg 1. \qquad (1)$$

This equation assumes that there are no mutual couplings between the I and Q paths. Moreover, when $G\alpha\beta \gg 1$, the signal gain is determined by $\alpha$ and $\beta$, making the nonlinearities and noise of the feedback path critical to system performance.

Figure 2:
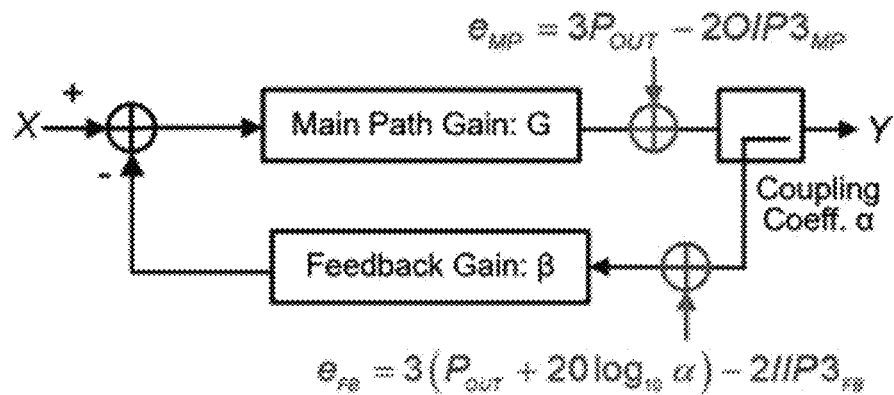
FIG. 2 illustrates a simplified linearity analysis model for a conventional Cartesian feedback architecture in accordance with the disclosed embodiments.

The following linearity analysis is based on the simplified model illustrated in FIG. 2. The transfer function of $e_{MP}$ and $e_{FB}$ to the output is $$Y = \frac{e_{MP}}{1+\alpha\beta G} + \frac{G\beta e_{FB}}{1+\alpha\beta G} \approx \frac{e_{MP}}{\alpha\beta G} \text{ when } G\alpha\beta \gg 1. \qquad (2)$$

This approximation shows that the nonlinearities of the main path are suppressed by the loop gain, and the nonlinearities of the feedback path are amplified by $1/\alpha$. Thus, it is important to reduce $e_{FB}$ and $1/\alpha$ to minimize the nonlinearities of the entire system. For simplicity, the above analysis assumes that all the variables are frequency-independent, which holds valid for in-band frequencies when the gain is not much affected by the frequency. Note that $e_{MP}$ and $e_{FB}$ depend on $P_{OUT}$ as shown in FIG. 2. Based on equation (2), when $G\alpha\beta \gg 1$, $e_{OUT,MP}$ and $e_{OUT,FB}$ can be written as:

$$e_{OUT,MP} = 3P_{OUT} - 2OIP3_{MP} - 20\log_{10}(\alpha\beta G); \text{ and} \qquad (3)$$

$$e_{OUT,FB} = 3P_{OUT} + 40\log_{10}\alpha - 2IIP3_{FB}. \qquad (4)$$

Thus, $e_{OUT,MP}$ is determined by $OIP3_{MP}$ and $G\alpha\beta$. Also, to ensure that $e_{OUT,FB} < e_{OUT,MP}$, a smaller a and a larger $IIP3_{FB}$ are required.

Figure 3:
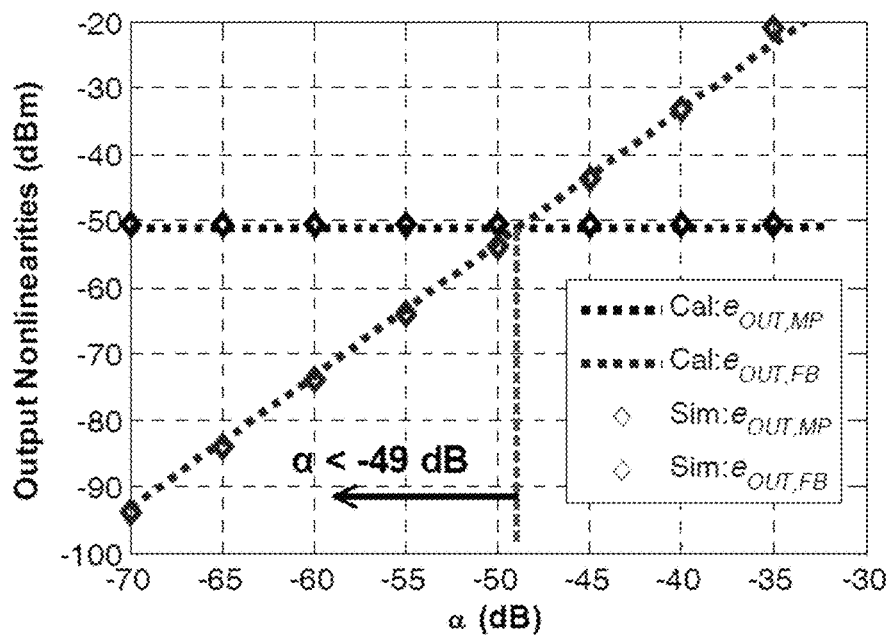
FIG. 3 illustrates calculated and simulated nonlinearities for a conventional Cartesian feedback architecture in accordance with the disclosed embodiments.

FIG. 3 plots $e_{OUT,MP}$ and $e_{OUT,FB}$ for different values of a. (In FIG. 3, the horizontal plot represents calculated $e_{OUT,FB}$ and the overlaid diamond shapes represent corresponding simulated values. Similarly, the diagonal plot represents calculated $e_{OUT,FB}$ and the overlaid diamond shapes represent corresponding simulated values.) Note that the calculations are consistent with the simulation results. Using the criterion $e_{OUT,FB} < e_{OUT,MP}$, it can be seen that a needs to be lower than −49 dB, over which $e_{OUT,FB}$ starts to dominate.

Figure 4:
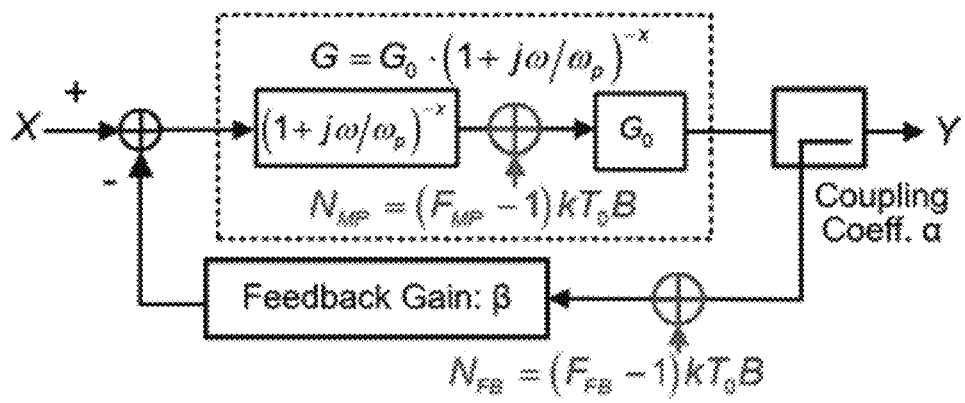
FIG. 4 illustrates a simplified noise-analysis model for a conventional Cartesian feedback architecture in accordance with the disclosed embodiments.

FIG. 4 illustrates a simplified model for noise analysis. In this model, frequency effects are taken into account because normally the out-of-band noise is important. In the noise model, the main path is partitioned into a frequency-dependent part $(1+j\omega/\omega_p)^{-x}$ and a frequency-independent part $G_0$. The frequency-dependent part is associated with the loop low-pass filter (LPF), and co, and x represent the pole and the order of the LPF, respectively. Note that the frequency-independent part includes the RF blocks. An assumption is made here that the radio frequency (RF) block bandwidth is much larger than $\omega_p$, which makes the RF block almost independent of the frequency of interest. $N_{MP}$ refers to the input of the frequency-independent part and is expressed by its noise factor $F_{MP}$. $N_{FB}$ refers to the input of the feedback path, and is expressed by its noise factor $F_{FB}$. Hence, the noise transfer function is $$Y = \frac{GN_{MP}}{1+\alpha\beta G} + \frac{G\beta N_{FB}}{1+\alpha\beta G} \approx \frac{N_{MP}}{\alpha\beta} + \frac{N_{FB}}{\alpha} \text{ when } G\alpha\beta \gg 1. \quad (5)$$

As stated earlier, T is used to represent $G\alpha\beta$. To express its dependence on frequency, T can be written as $T=T_0 \cdot (1+j\omega/\omega_p)^{-x}$, in which $T_0$ represents the frequency-independent part of the loop gain. From equation (5), the output noise of the main path $N_{OUT,MP}$ and the feedback path $N_{OUT,FB}$ are defined as follows $$N_{OUT,MP} = \frac{kT_0 B(F_{MP}-1)G_0^2}{|1+T_0 \cdot (1+j\omega/\omega_p)^{-x}|^2} \quad (6)$$

$$N_{OUT,FB} = \frac{kT_0 B(F_{FB}-1)}{\alpha^2 |1+T_0^{-1} \cdot (1+j\omega/\omega_p)^x|^2}, \quad (7)$$

wherein $N_{OUT,MP}$ is suppressed by the loop gain $T_0$, and $N_{OUT,FB}$ increases as α decreases. Thus, α needs to be high to reduce the noise of the feedback path. At the same time, α needs to be small to reduce the nonlinearities of the feedback path in equation (5). This conflict in the selection of α represents the inherent linearity versus noise tradeoff for Cartesian feedback loops.

Because the noise response is frequency-dependent, the LPF order x and pole $\omega_p$ are determined first. The gain-bandwidth product (GBW) is a general term, which is used to evaluate the frequency response of the feedback loop. Given a general feedback loop with a pole of $\omega_p$, an order of x and a loop gain of $T_0$, GBW can be expressed as $$GBW = \sqrt{(T_0^{2/x}-1)} \cdot \omega_p \approx T_0^{1/x} \cdot \omega_p \text{ when } T_0 \gg 1. \quad (8)$$

By further taking the path delay $\tau_d$ of the loop into consideration, the loop phase margin (PM) can be expressed as $$PM = 180° - x \cdot \tan^{-1}\left(\sqrt{T_0^{2/x}-1}\right) - \sqrt{T_0^{2/x}-1} \cdot \omega_p \tau_d \cdot 360°. \quad (9)$$

Figure 5:
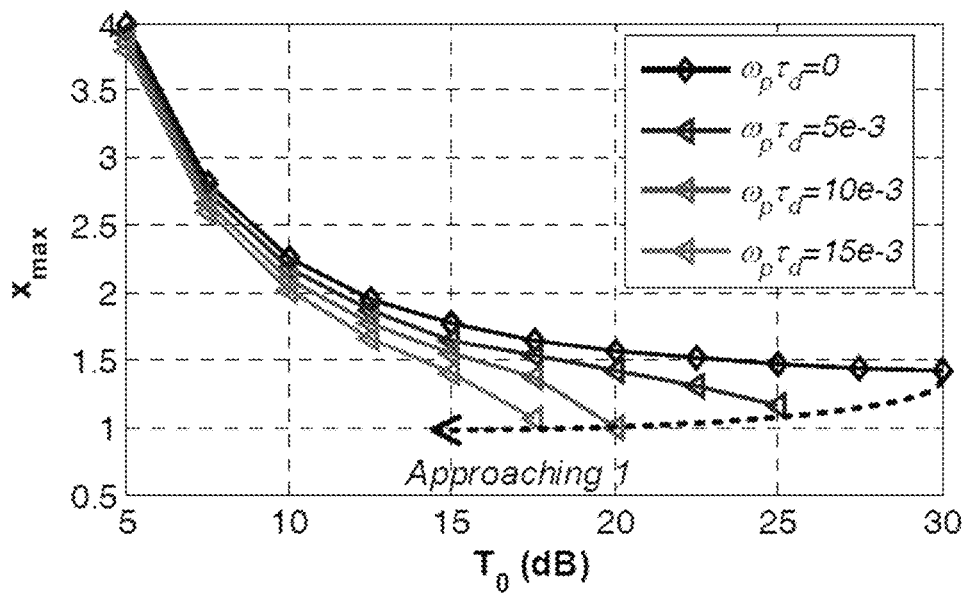
FIG. 5 illustrates a maximum allowed LPF order versus loop gains and path delays when targeting at PM=60 for a conventional Cartesian feedback architecture in accordance with the disclosed embodiments.

Thus, the path delay degrades the loop phase margin. From equation (9), see that $T_0$, $\tau_d$ and PM (usually target at >60°) constrain the x values. FIG. 5 plots the maximum allowed x values for different $T_0$ and $\tau_d$ for the case where PM=60°. (The top plot in FIG. 5 represents $\omega_p\tau_d$=0, the next plot represents $\omega_p\tau_d$=5e−3, the next plot represents 10e−3 and the bottom plot represents 15e−3.) Note that when $\omega_p\tau_d$ equals 5e−3, 10e−3 and 15e−3, the curves are cut off at $T_0$ values of 25 dB, 20 dB and 17.5 dB, respectively, indicating that the requirement PM=60° cannot be achieved. FIG. 5 also shows that as $\tau_d$ increases, the maximum allowed x gradually approaches 1. Thus, to be safe, x is chosen to be 1 in our analysis. The selection of $\omega_p$ is based on a rule in [Ishihara2010] (H. Ishihara, M. Hosoya, S. Otaka and O. Watanabe, "A 10-MHz Signal Bandwidth Cartesian Loop Transmitter Capable of Off-Chip PA Linearization," in *IEEE Journal of Solid-State Circuits*, vol. 45, no. 12, pp. 2785-2793, December 2010). Note that $\omega_p$ is set to be three times the signal bandwidth to include the $3^{rd}$-order inter-modulation (IM3) products, as well as to provide a factor of two bandwidth margin. In the case of a WCDMA signal bandwidth of 3.84 MHz, $\omega_p$ is set to be 12 MHz.

Figure 6:
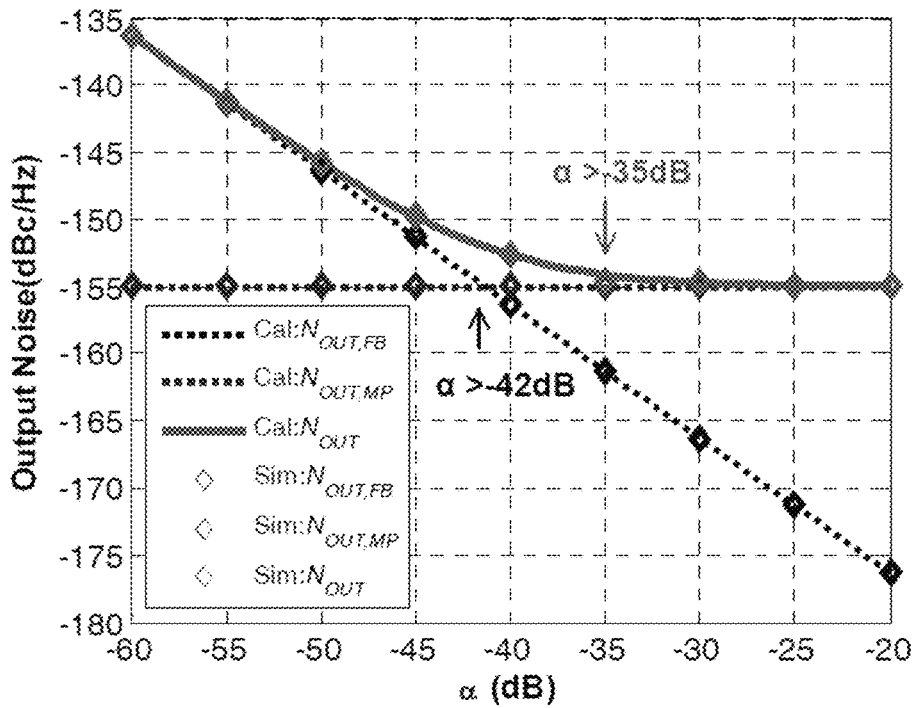
FIG. 6 illustrates output noise of the feedback path, the main path and the total noise for a conventional Cartesian feedback architecture in accordance with the disclosed embodiments.

FIG. 6 plots the output noise of the main path and feedback path and the total noise at 45 MHz offset (receiver band) for different values of a. (In FIG. 6, the horizontal plot represents calculated $N_{OUT,MP}$ values, and the overlaid diamond shapes represent corresponding simulated values. Similarly, the diagonal plot represents calculated $N_{OUT,FB}$ values, and the overlaid diamond shapes represent corresponding simulated values. Finally, the curved plot represents calculated $N_{OUT}$ values, and the overlaid diamond shapes represent corresponding simulated values.) As illustrated in FIG. 6, the calculated values agree well with the simulated values. From FIG. 6, see the following: (1) $N_{OUT,MP}$ is a constant value of −155 dBc/Hz, because $G_0$ is roughly 40 dB to ensure $G_{SIG}$>20 dB; and (2) $N_{OUT,FB}$ decreases as α increases. When α>−42 dB, $N_{OUT,FB}$ drops below −154 dBc/Hz. Considering the contribution of $N_{OUT,MP}$, α needs to be larger than −35 dB to ensure that $N_{OUT,FB}$<−154 dBc/Hz.

From FIG. 3 and FIG. 6, note that the requirements on α from the noise perspective and the linearity perspective are in conflict with each other. The noise contribution from the main path is also significant, making the noise requirement on the feedback path more stringent. Considering that α needs to be larger than −35 dB from FIG. 6 and smaller than −49 dB from FIG. 3, there is a gap region of 14 dB for α, in which the system linearity and noise requirements cannot be satisfied simultaneously. This gap region represents the fundamental linearity versus noise tradeoff in Cartesian feedback loops. Note that the gap region becomes larger as $P_{out}$ increases (e.g., the required maximum output power is 24 dBm for WCDMA power class 3, and 23 dBm for LTE UE transmit power class 3). This means that the conventional Cartesian feedback loop cannot be effectively applied in high-power applications.

Cartesian Error-Feedback Architecture

The previous discussion shows that the high output noise of conventional Cartesian feedback loops is caused by two factors: (1) α needs to be small to satisfy the system linearity requirement, which causes the output noise of the feedback path to increase significantly; and (2) the output noise of the main path is also significant because the main path gain has to be large to satisfy the system gain requirement. Apart from that, no high-order LPF, such as a surface acoustic wave (SAW) filter, can be used in the loop to suppress out-of-band noise in the loop because of stability concerns from FIG. 5. In this case, if the signal to the feedback path can be cancelled by intentionally introducing an extra feedforward path, the nonlinearities in the feedback path can be suppressed. Thus, larger α values are possible, and the feedback path noise will be suppressed from equation (7). Moreover, the signal gain increases because less signal is fed back. So less main path gain is required to satisfy the overall signal gain ($G_{SIG}$>20 dB), resulting in less noise on the main path.

Hence, this feedforward path can fundamentally mitigate the linearity-noise tradeoff. Using the simple model in FIG. 7, in which γ is the feedforward path gain, the system output becomes $$Y = \frac{G(1+\beta\gamma)}{1+G\alpha\beta} \cdot X = \frac{G}{1+G\alpha\beta\frac{1-\gamma/G\alpha}{1+\beta\gamma}} \cdot X. \quad (10)$$

The additional term in the denominator of equation (10), compared with that of equation (1), represents the extra attenuation that results from using the feedforward path. If η is assigned as $$\eta = \frac{1-\gamma/G\alpha}{1+\beta\gamma}, \quad (11)$$

equation (10) becomes, $$Y = \frac{G}{1+G\alpha\beta\eta} \cdot X. \quad (12)$$

When the gain of the feedforward path is perfectly matched with Gα (i.e., γ=Gα) and η=0, the system signal gain becomes G and is irrelevant to the feedback path. Note that when η decreases, the signal gain increases. Or equivalently, G can be smaller to maintain the same $G_{SIG}$, resulting in less $N_{OUT,MP}$ based on equation (6).

Figure 7:
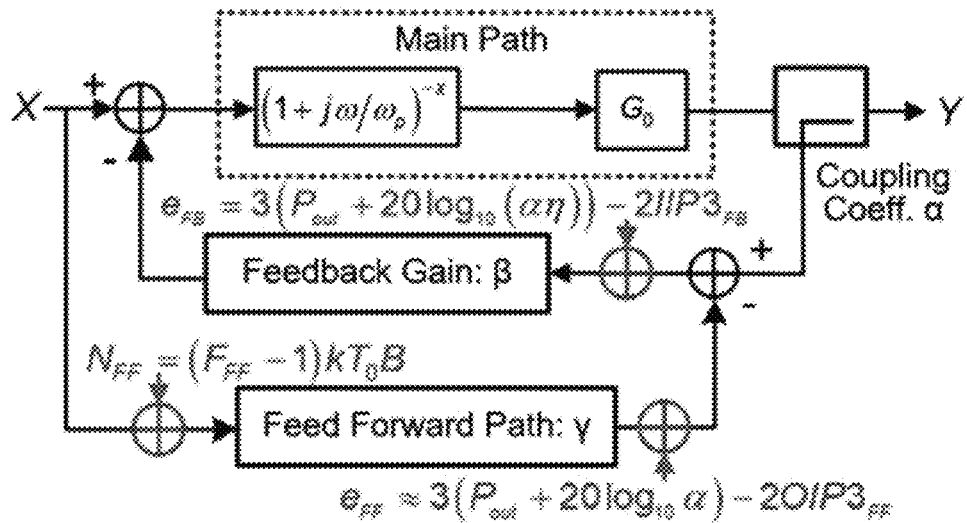
FIG. 7 illustrates a simplified linearity and noise analysis model for a Cartesian error-feedback architecture in accordance with the disclosed embodiments.
Figure 8:
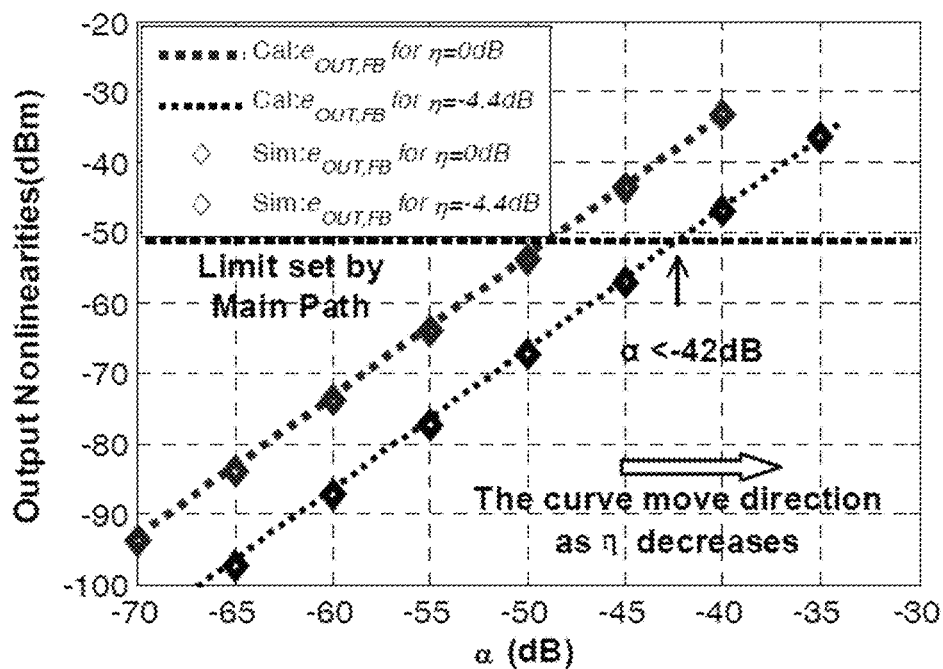
FIG. 8 illustrates output nonlinearities of the feedback path for a Cartesian error-feedback architecture in accordance with the disclosed embodiments.

Because of the feedforward path, the feedback signal becomes $P_{OUT}$+20 log$_{10}$ (αη). Note that the nonlinearities of the main path remain unchanged, as is illustrated by equation (3). However, the nonlinearities of the feedback path become $$e_{FB}=3(P_{OUT}+20\log_{10}(\alpha\eta))-2IIP3_{FB} \quad (13)$$

as is shown in FIG. 7. The expressions of $e_{OUT,MP}$ and $e_{OUT,FB}$ by $e_{MP}$ and $e_{FB}$ are still consistent with equation (2). Hence, $e_{OUT,FB}$ becomes $$e_{OUT,FB}=3(P_{OUT}+20\log_{10}\eta)+40\log_{10}\alpha-2IIP3_{FB}, \quad (14)$$

wherein $e_{OUT,FB}$ can still be described by equation (4). From equation (14), note that small η helps suppress $e_{OUT,FB}$. FIG. 8 shows the effects of η on the relationship between $e_{OUT,FB}$ and a. (In FIG. 8, the upper plot represents calculated $e_{OUT,FB}$ for η=0 dB, and the overlaid diamond shapes represent corresponding simulated values. Similarly, the lower plot represents calculated $e_{OUT,FB}$ for η=-4.4 dB, and the overlaid diamond shapes represent corresponding simulated values.) As illustrated in FIG. 8, the condition η=0 dB represents the case without the feedforward path. As η decreases, $e_{OUT,FB}$ decreases for the same α value, and the curves move rightward as indicated by the arrow. When η decreases to −4.4 dB, the requirement of α to satisfy the linearity requirement ($e_{OUT,FB}$<$e_{OUT,MP}$) becomes α<−42 dB.

In conventional Cartesian feedback loops, in order to satisfy the signal gain requirement, the main path needs large gain, thus contributing significant noise from equation (6). In this way, the noise requirement of the feedback path becomes more stringent. Therefore, by introducing η to lower the main path gain requirement, the noise requirement of the feedback path is also relieved.

Figure 9:
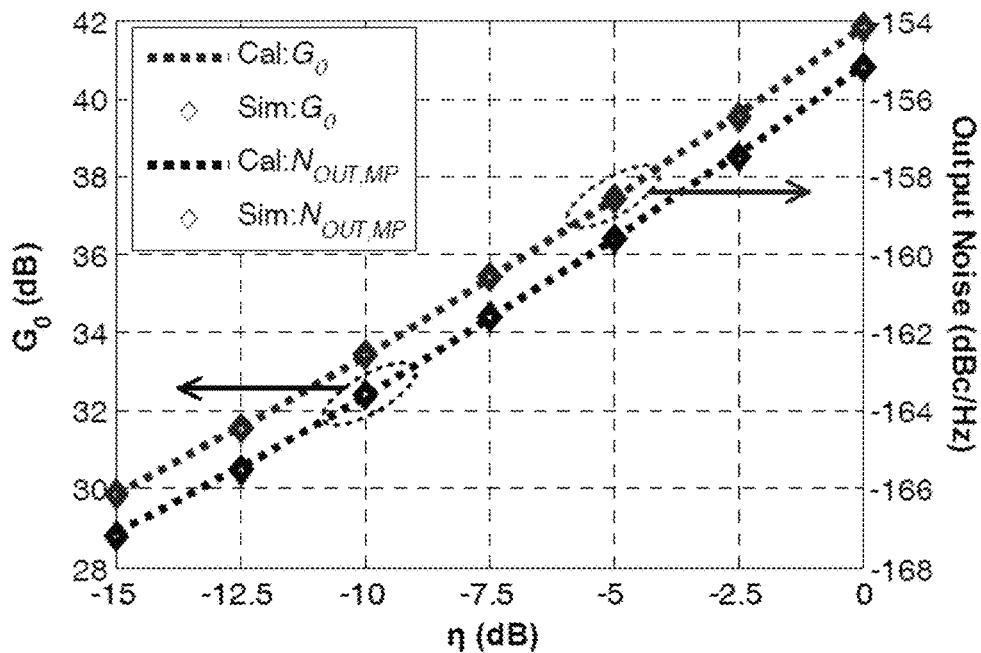
FIG. 9 illustrates gain and corresponding output noise of the main path for a Cartesian error-feedback architecture in accordance with the disclosed embodiments.
Figure 10:
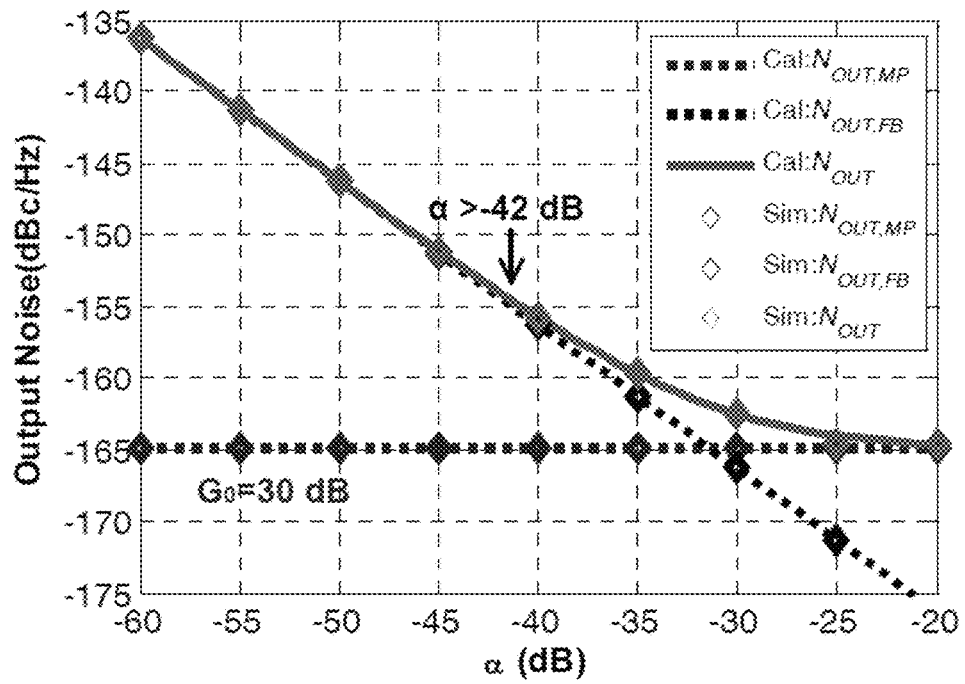
FIG. 10 illustrates output noise of the feedback path, the main path and total noise for a Cartesian error-feedback architecture in accordance with the disclosed embodiments.

Referring to FIG. 9, the upper plot represents calculated $G_0$ and the overlaid diamond shapes represent corresponding simulated values. Similarly, the lower plot represents calculated $N_{OUT,MP}$ and the overlaid diamond shapes represent corresponding simulated values. Note that the left y-axis in FIG. 9 shows the required main path gain $G_0$ for different values of η to maintain $G_{SIG}$>20 dB from equation (12). The right y-axis of FIG. 9 plots the corresponding $N_{OUT,MP}$. As η decreases, a smaller $G_0$ is needed, resulting in less noise from the main path. For an η of −15 dB, $G_0$ only needs to be larger than 28.8 dB to achieve >20 dB signal gain. FIG. 10 shows the changes of $N_{OUT}$ when $G_0$ is reduced to 30 dB. (In FIG. 10, the horizontal plot represents calculated $N_{OUT,MP}$ and the overlaid diamond shapes represent corresponding simulated values. Similarly, the diagonal plot represents calculated $N_{OUT,MP}$ and the overlaid diamond shapes represent corresponding simulated values. Finally, the curved plot represents calculated $N_{OUT}$ and the overlaid diamond shapes represent corresponding simulated values.) In contrast with FIG. 6, in FIG. 9 $N_{OUT,MP}$ decreases to −165 dBc/Hz, and $N_{OUT}$ starts to be dominated by $N_{OUT,FB}$.

In this case, a only needs to be larger than −42 dB to satisfy the system noise requirement ($N_{OUT}$<−154 dBc/Hz). In contrast with FIG. 8, an η value of −15 dB is enough to provide a window of a values that satisfy the linearity and noise requirements simultaneously.

The fundamental linearity versus noise tradeoff in conventional Cartesian feedback loops lies in the conflicting requirements of a for linearity and noise considerations. By introducing the feedforward path, another degree of design freedom η is provided, wherein η is able to equivalently attenuate the input signal of the feedback path. When η is small enough, the linearity requirement of the feedback path is greatly relieved. Thus, α values can be selected only for noise considerations while still satisfying the linearity requirement. Moreover, small η values reduce the gain requirement of the main path. In this way, the output noise from the main path is also reduced, further relieving the noise requirement on the feedback path.

Requirements on the Feedforward Path

The above analysis does not include the noise and nonlinearities from the feedforward path, which is covered by this section. The noise of the feedforward path $N_{FF}$ is expressed by its noise factor $F_{FF}$ with reference to the input, as shown in FIG. 7. Its transfer function is $$Y = N_{FF} \cdot \frac{G\beta\gamma}{1+\alpha\beta G}, \quad (15)$$

so the output noise of the feedforward path is $$N_{OUT,FF} = \frac{kT_0B(F_{FF}-1)\gamma^2}{\alpha^2 \cdot |1+T_0^{-1}\cdot(1+j\omega/\omega_p)^x|^2}, \quad (16)$$

where $\gamma$ represents the feedforward path gain. For simplicity, it is assumed that the gain of the feedforward path matches well the product of the in-band gain of the main path $G_0$ and $\alpha$ ($\gamma=\alpha G_0$). Then, equation (16) becomes $$N_{OUT,FF} = \frac{kT_0B(F_{FF}-1)G_0^2}{|1+T_0^{-1}\cdot(1+j\omega/\omega_p)^x|^2}. \quad (17)$$

Therefore, to lower $N_{OUT,FF}$, $F_{FF}$ and $G_0$ need to be smaller for a constant loop gain $T_0$. Given a fixed $F_{FF}$ value, $N_{OUT,FF}$ can be suppressed by decreasing $G_0$ from the system level.

Figure 11:
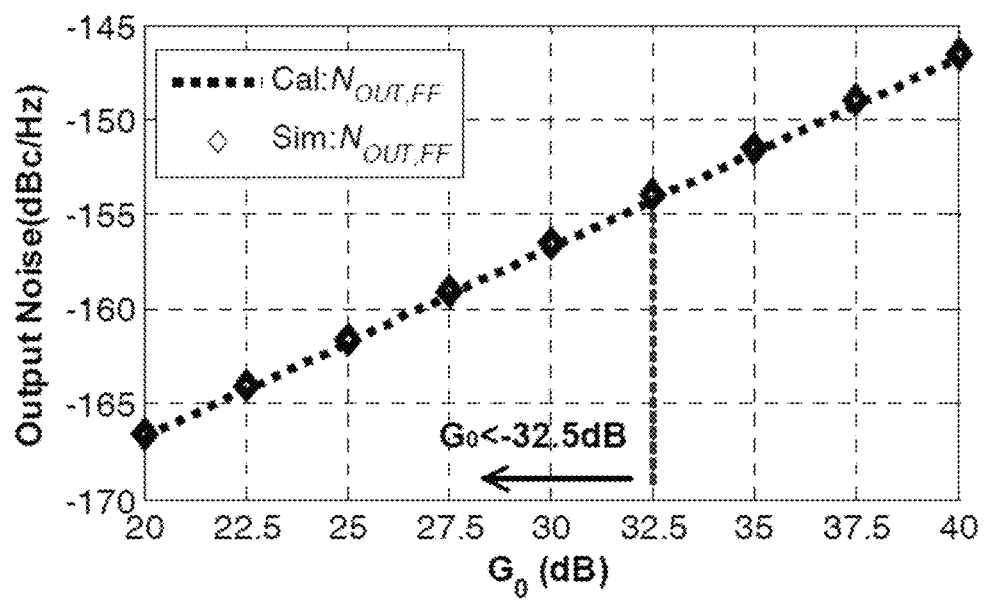
FIG. 11 illustrates output noise of the feedforward path for a Cartesian error-feedback architecture in accordance with the disclosed embodiments.

Giving $F_{FF}$ the same value 10 dB, as $F_{MP}$, FIG. 11 presents the output noise of the feedforward path $N_{OUT,FF}$, for different values of $G_0$. As shown in FIG. 11, $G_0$ needs to be below 32.5 dB to make $N_{OUT,FF}$<−154 dBc/Hz. Referring back to FIG. 8, II has to be smaller than −4.4 dB. Overall, an II value of −15 dB will provide a good design margin.

The nonlinearities of the feedforward path $e_{FF}$ with reference to its output are illustrated in FIG. 7. The transfer function of $e_{FF}$ to the output is $$Y = \frac{G\beta e_{FF}}{1+\alpha\beta G}. \quad (18)$$

Thus, $e_{OUT,FF}$ can be expressed as $$e_{OUT,FF}=3P_{OUT}+20\log_{10}\alpha-2OIP3_{FF}, \quad (19)$$

which is proportional to $\alpha$ and inversely proportional to $OIP3_{FF}$. Thus, a lower $\alpha$ and a higher $OIP3_{FF}$ are preferred to reduce $e_{OUT,FF}$.

Figure 12:
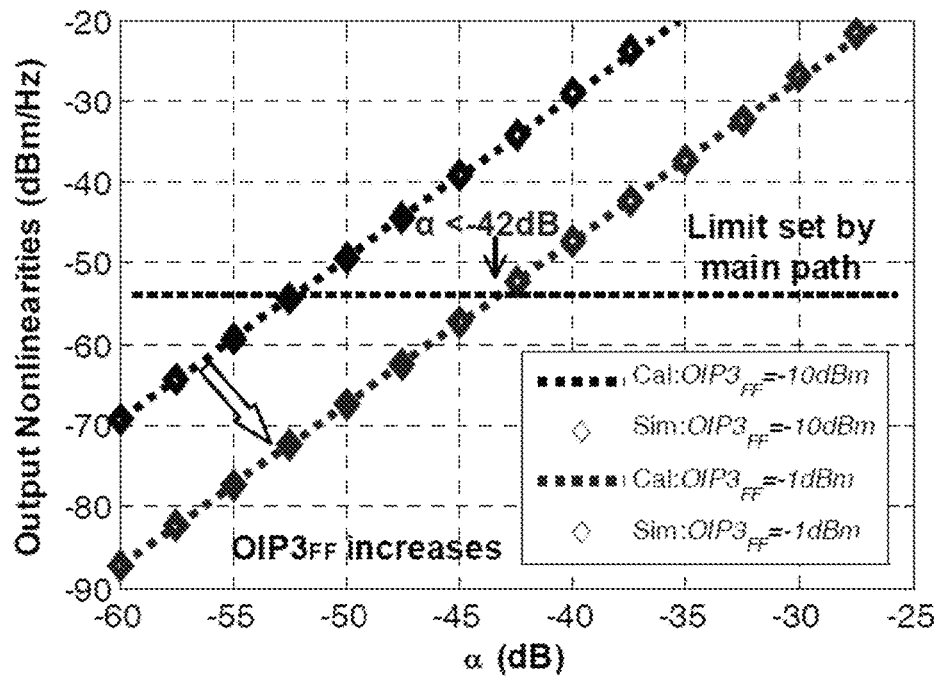
FIG. 12 illustrates output nonlinearities of the feedforward path for a Cartesian error-feedback architecture in accordance with the disclosed embodiments.

FIG. 12 shows the relationship between $e_{OUT,FF}$ and $\alpha$ for $OIP3_{FF}$ values of −10 dBm and −1 dBm. (In FIG. 12, the upper plot represents calculated values for $OIP3_{FF}$=−10 dBm and the overlaid diamond shapes represent corresponding simulated values. Similarly, the lower plot represents calculated values for $OIP3_{FF}$=−1 dBm and the overlaid diamond shapes represent corresponding simulated values.) In FIG. 12, the arrow indicates that the $e_{OUT,FF}$ curve moves rightward as $OIP3_{FF}$ increases for the same $\alpha$ values. For $OIP3_{FF}$=−1 dBm, $\alpha$ needs to be smaller than −42 dB to make $e_{OUT,FF}$<$e_{OUT,MP}$. Considering the dependence of $e_{OUT,FF}$ on $\alpha$ when $OIP3_{FF}$ increases, $OIP3_{FF}$>−1 dBm is able to satisfy both the system noise and linearity requirements simultaneously by properly choosing $\alpha$.

Figure 13A:
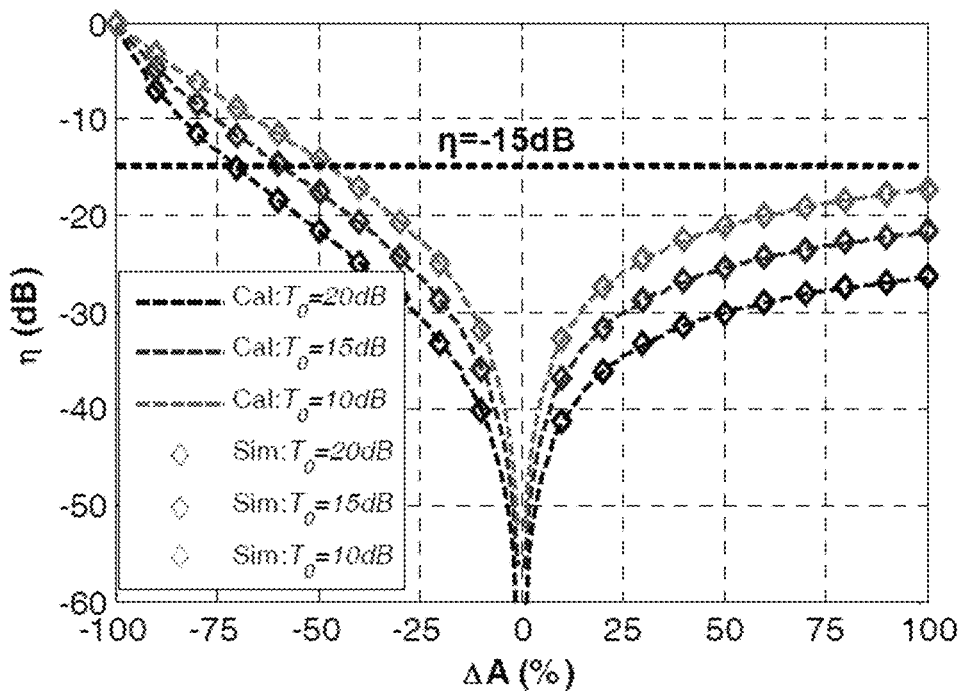
FIG. 13A illustrates $\eta$ as a function of $\Delta A$ for a Cartesian error-feedback architecture in accordance with the disclosed embodiments.
Figure 13B:
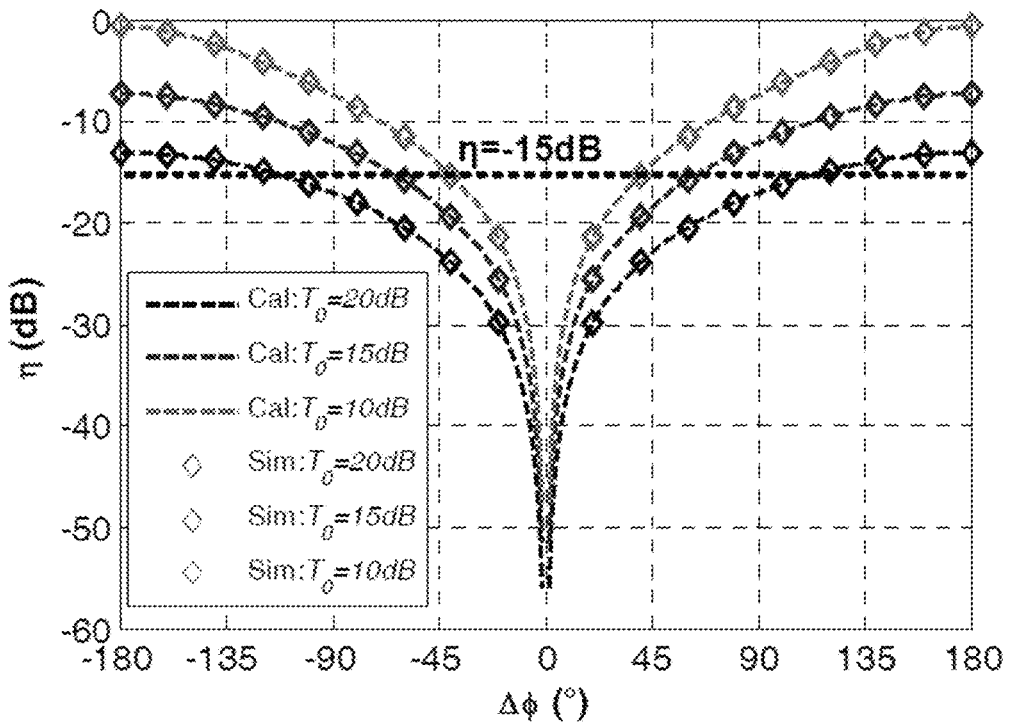
FIG. 13B illustrates $\eta$ as a function of $\Delta \varphi$ for a Cartesian error-feedback architecture in accordance with the disclosed embodiments.

The above analysis relies on $\eta$, which is decided by the matching conditions between $\gamma$ and $G\alpha$. The expressions of $\eta$ can be found in equation (11). Assume $\gamma=(A_0+\Delta A)e^{j\Delta\phi}$, in which $A_0$ indicates the magnitude of $G\alpha$, $\Delta A$ represents the magnitude error, and $\Delta\phi$ represents the phase error. Then, equation (11) becomes $$\eta = \frac{1-(1+\Delta A/A_0)e^{j\Delta\phi}}{1+T_0(1+\Delta A/A_0)e^{j\Delta\phi}}, \quad (20)$$

which shows that increasing $|\Delta A|$ and $|\Delta\phi|$ causes $\eta$ to increase, and increasing $T_0$ causes $\eta$ to decrease. To determine the exact dependence of $\eta$ on $|\Delta A|$ and $|\Delta\phi|$, FIGS. 13A and 13B plot $\eta$ for different values of $|\Delta A|$ and $|\Delta\phi|$ with varying $T_0$. (In FIGS. 13A and 13B, the upper plot represents calculated values for $T_0$=10 dB and the overlaid diamond shapes represent corresponding simulated values. The middle plot represents calculated values for $T_0$=15 dB and the overlaid diamond shapes represent corresponding simulated values. Finally, the lower plot represents calculated values for $T_0$=20 dB and the overlaid diamond shapes represent corresponding simulated values.) Note that these simulation results agree well with the calculation results from equation (20). As shown in FIGS. 13A and 13B, when $T_0$ increases, the requirements on $|\Delta A|$ and $|\Delta\phi|$ become looser, because the feedback loop is able to track the input signal. An $\eta$ value of −15 dB is actually easy to achieve based on the plots shown in FIGS. 13A-13B. This greatly simplifies the feedforward path design. By contrast, exact magnitude and phase-matching conditions are hard to achieve at RF frequencies, as is encountered in the polar transmitter design.

The above analysis shows that by lowering the main path gain, the noise requirement on the feedforward path can be satisfied, as shown in FIG. 11. It also shows that the linearity requirement on the feedforward path is achievable ($OIP3$>−1 dBm). Apart from that, an off-chip filter can be placed in the feedforward path to suppress its out-of-band noise without affecting loop stability. If the feedforward path is on-chip, $OIP3_{FF}$ can be referred to a high impedance instead of 50Ω, thus further relieving the linearity requirement on the feedforward path.

Figure 13C:
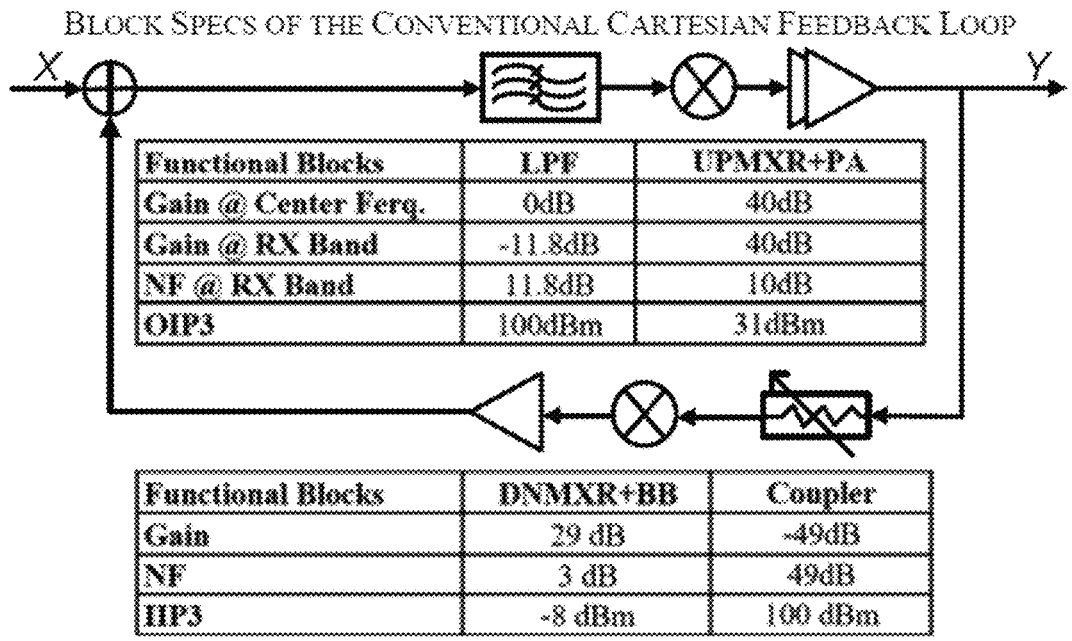
FIG. 13C presents a table listing block specifications for a conventional Cartesian feedback loop architecture in accordance with the disclosed embodiments.
Figure 13D:
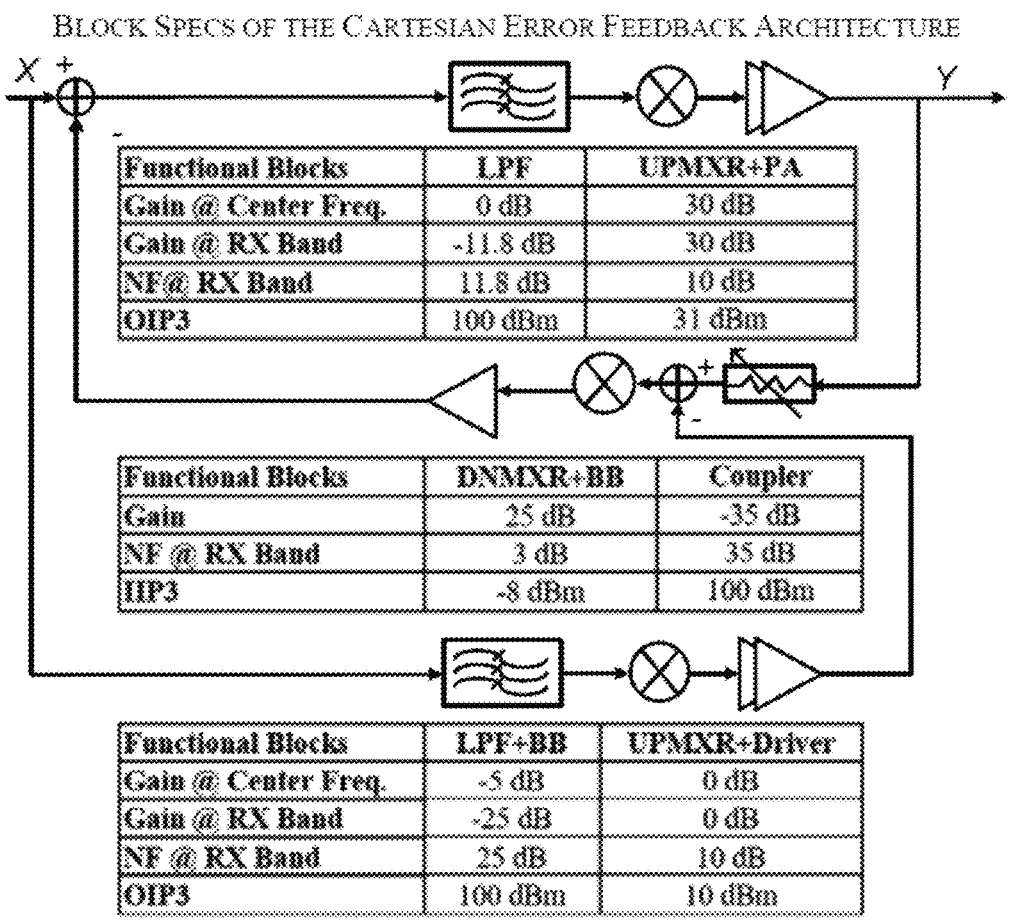
FIG. 13D presents a table listing block specifications for a Cartesian error feedback loop architecture in accordance with the disclosed embodiments.

FIG. 13D presents a table that summarizes the above analysis and assigns the specifications for each block. The LPF on the feedforward path is outside the loop, and its order does not affect the loop stability. The cancellation ratio is assumed to be 15 dB (meaning $\eta$ is −15 dB) with the amplitude and phase accuracies specified in FIGS. 13A-13B. By contrast, the specifications of conventional architecture are given in the table that appears in FIG. 13C with a of −49 dB and $G_0$ of 40 dB.

Figure 14:
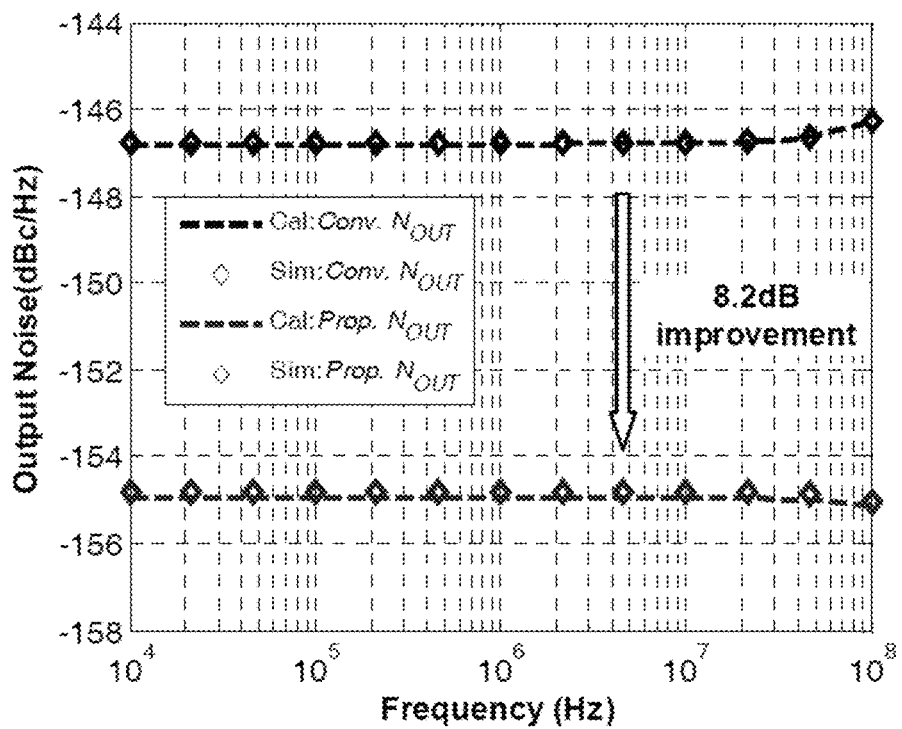
FIG. 14 compares output noise for a conventional Cartesian feedback loop with output noise for a Cartesian error-feedback loop in accordance with the disclosed embodiments.

The top plot in FIG. 14 illustrates the output noise of a conventional Cartesian feedback loop and the bottom plot illustrates output noise for the new Cartesian error-feedback loop. Note that in the conventional Cartesian feedback loop, the noise is dominated by the feedback path because a is chosen to be a low value (≤49 dB) to meet the linearity requirement. In the proposed Cartesian error-feedback loop, the coupling coefficient $\alpha$ can be increased to reduce the noise from the feedback path. Referring to FIG. 14, note that the proposed error-feedback loop achieves more than 8 dB noise improvement over the conventional Cartesian feedback loop.

Figure 15:
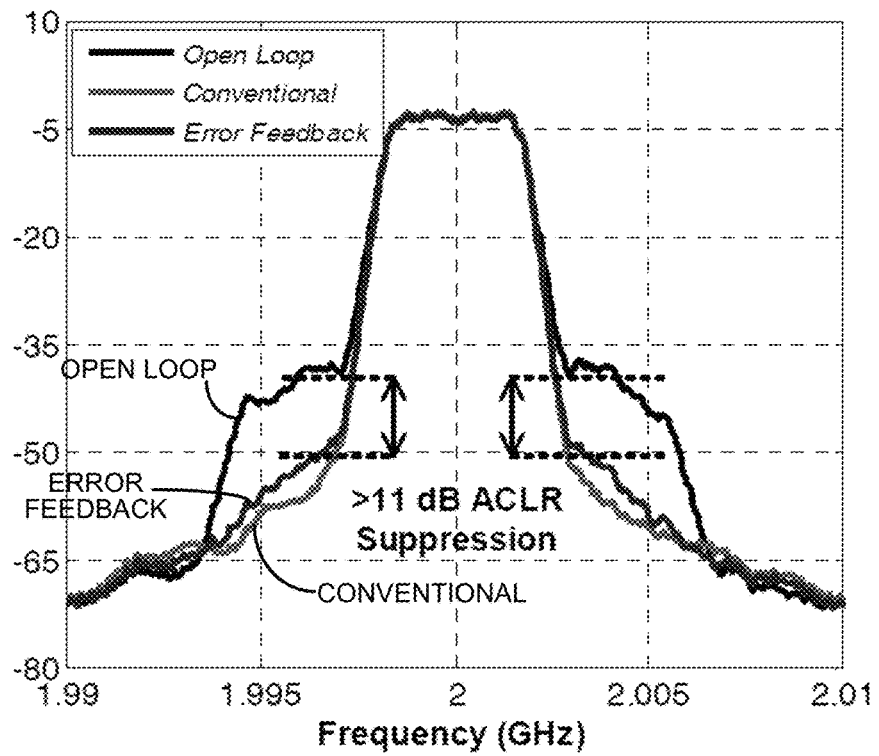
FIG. 15 compares output spectra of an open loop, a conventional Cartesian feedback loop, and a Cartesian error-feedback loop in accordance with the disclosed embodiments.
Figure 16:
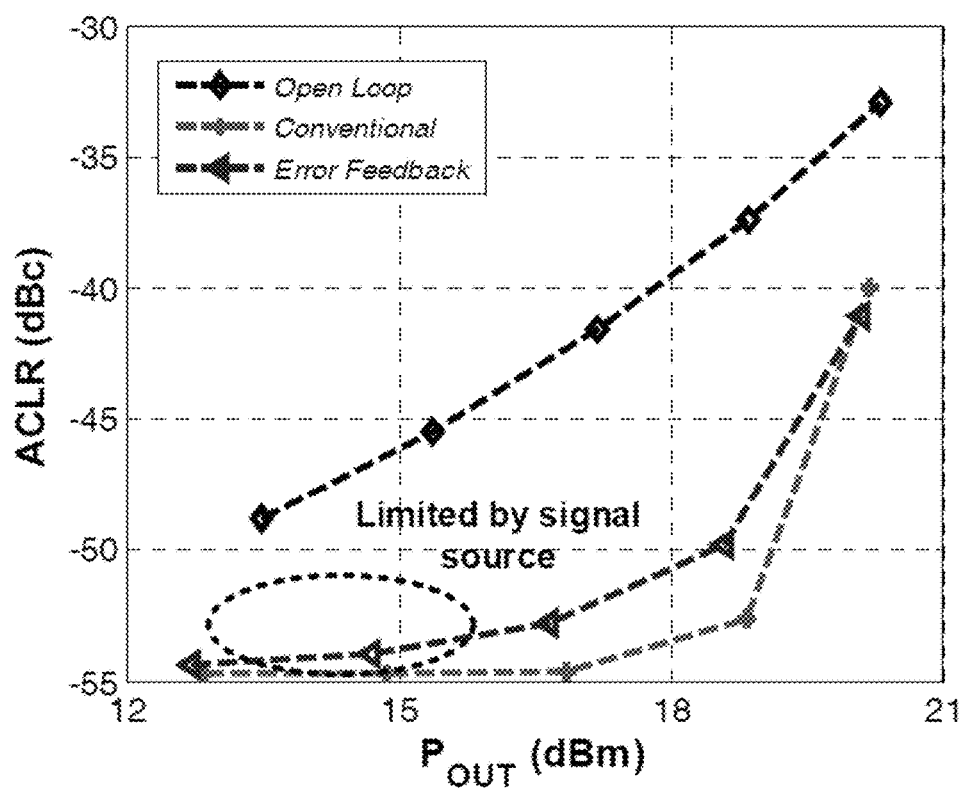
FIG. 16 plots an adjacent channel leakage ratio (ACLR) versus output power for three different transmitter architectures in accordance with the disclosed embodiments.

FIG. 15 plots the output spectra for three cases: an open loop without any linearization; a conventional Cartesian feedback loop; and the proposed Cartesian error-feedback loop. Note that compared with the open loop, the conventional Cartesian feedback loop can suppress ACLR by 14.5 dB, and the Cartesian error-feedback loop can suppress ACLR by 12.6 dB. More specifically, FIG. 16 illustrates the ACLR of the above-mentioned three cases for different output powers. At low power levels, ACLR is limited by the signal source. Both the conventional Cartesian feedback loop and Cartesian error-feedback loop achieve significant suppressions on ACLR because α in conventional Cartesian feedback loops is selected to satisfy linearity constraints.

CONCLUSION

The poor noise performance of conventional Cartesian feedback loops is caused by the large attenuation used in the feedback path to address linearity concerns. This causes the inherent linearity-noise tradeoff. To mitigate this tradeoff, an external feedforward path for signal cancellation is placed in front of the feedback path, which allows for smaller attenuation of the feedback path, thereby greatly relieving the linearity requirements for the feedback path.

Based on a theoretical analysis, the requirements related to nonlinearity and noise for the feedforward path are achievable without degrading overall system performance. Also, to further suppress the out-of-band noise of the feedforward path, an off-chip filter can be placed in the feedforward path without affecting the loop stability. On the other hand, if the design is on-chip, the linearity of the feedforward path can be relieved by referring to a higher impedance than 50Ω. These details further ensure that the nonlinearities and noise of the feedforward path will not constrain system performance.

The amplitude and phase-matching requirements can also be relieved because of the feedback loop. This greatly simplifies the feedforward path design, which contrasts with the stringent amplitude and phase-matching requirements demanded by the polar transmitter architecture.

To validate the concept, behavior-level system simulations were conducted using a WCDMA signal source. In these simulations, the Cartesian error-feedback architecture demonstrated a significant improvement in noise performance while achieving comparable linearity as compared with a conventional Cartesian feedback architecture.

Process of Operation

Figure 17:
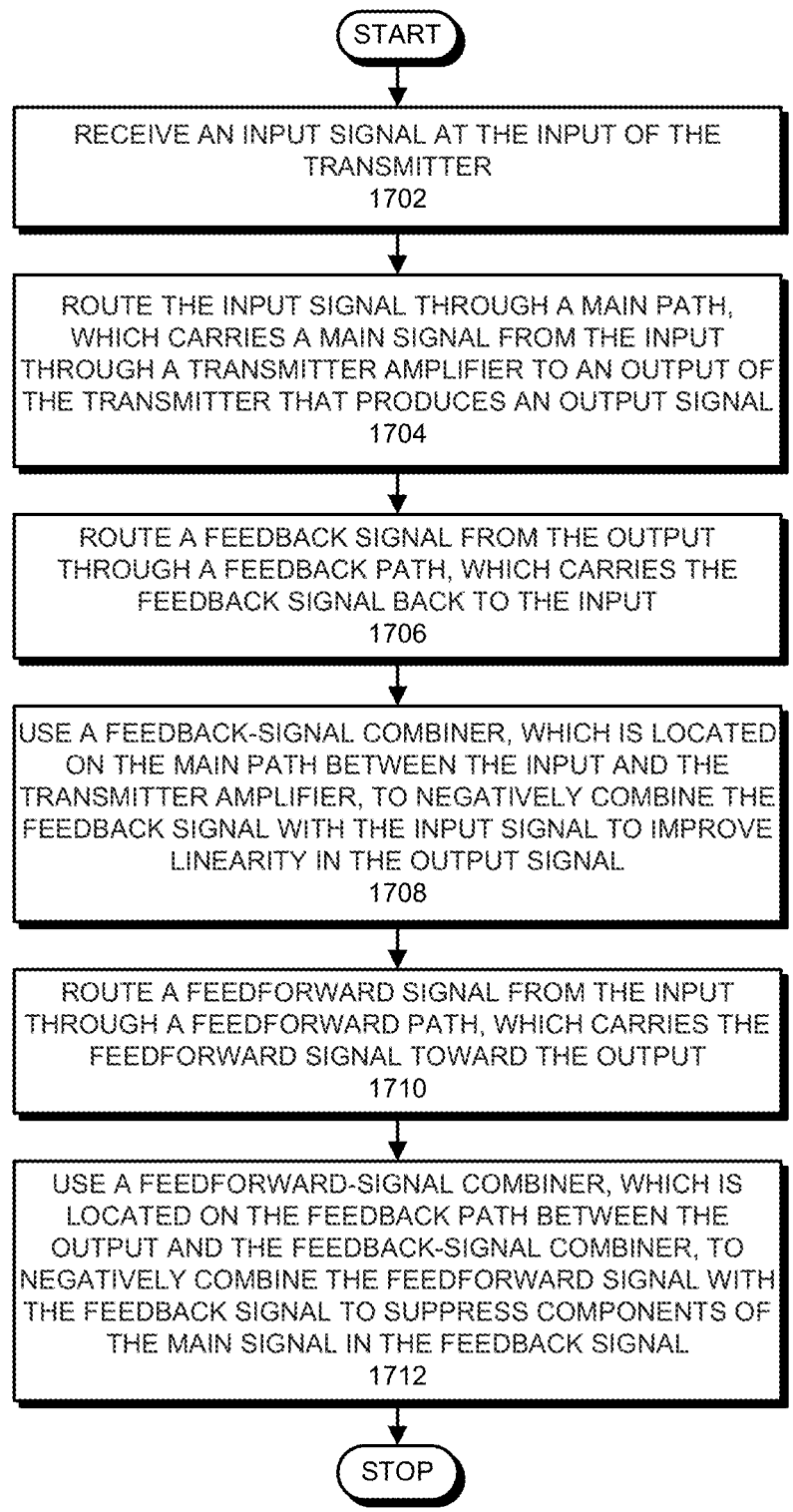
FIG. 17 presents a flow chart illustrating the process of operating an error-feedback transmitter in accordance with the disclosed embodiments.

FIG. 17 presents a flow chart illustrating the process of operating an error-feedback transmitter in accordance with the disclosed embodiments. First, the transmitter receives an input signal at an input of the transmitter (step 1702). Next, the transmitter routes the input signal through a main path, which carries a main signal from the input through a transmitter amplifier to an output of the transmitter that produces an output signal (step 1704). The transmitter also routes a feedback signal from the output through a feedback path, which carries the feedback signal back to the input (step 1706). Next, the transmitter uses a feedback-signal combiner, which is located on the main path between the input and the transmitter amplifier, to negatively combine the feedback signal with the input signal to improve linearity in the output signal (step 1708). The transmitter also routes a feedforward signal from the input through a feedforward path, which carries the feedforward signal toward the output (step 1710). Next, the transmitter uses a feedforward-signal combiner, which is located on the feedback path between the output and the feedback-signal combiner, to negatively combine the feedforward signal with the feedback signal to suppress components of the main signal in the feedback signal (step 1712).

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. An error-feedback transmitter, comprising:
   an input that receives an input signal;
   an output that produces an output signal;
   an amplifier, which is located between the input and the output;
   a main path that carries a main signal from the input through the amplifier to the output;
   a feedback path that carries a feedback signal from the output back to the input;
   a feedback-signal combiner, which is located on the main path between the input and the amplifier, and which negatively combines the feedback signal with the input signal to improve linearity in the output signal;
   a feedforward path that carries a feedforward signal from the input toward the output; and
   a feedforward-signal combiner, which is located on the feedback path between the output and the feedback-signal combiner, and which negatively combines the feedforward signal with the feedback signal to suppress components of the main signal in the feedback signal;
   wherein the input signal is a baseband signal and the output signal is a modulated signal; and
   wherein the error-feedback transmitter further comprises:
      an upconverter mixer for the main signal, which is located on the main path between the feedback-signal combiner and the amplifier;
      a downconverter mixer for the feedback signal, which is located on the feedback path between the feedforward signal combiner and the feedback-signal combiner; and
      an upconverter mixer for the feedforward signal, which is located on the feedforward path between the input and the feedforward-signal combiner.

2. The error-feedback transmitter of claim 1, wherein the feedforward-signal combiner and the feedforward path are designed so that when the feedback and feedforward signals are combined, the feedback and feedforward signals are out of phase and have similar magnitudes, whereby the components of the main signal are substantially eliminated from the feedback signal.

3. The error-feedback transmitter of claim 1, wherein the input signal is a modulated signal and the output signal is also a modulated signal.

4. The error-feedback transmitter of claim 1,
   wherein the input comprises two inputs $X_I$ and $X_Q$ that carry separate quadrature components for a quadrature amplitude modulation (QAM) encoding scheme;
   wherein the main path includes separate paths for the two inputs $X_I$ and $X_Q$ that feed through two separate feedback-signal combiners and two separate upconverter mixers before being combined into a single input signal that passes through the amplifier;
   wherein the feedback path splits after the feedforward-signal combiner to form two separate feedback paths associated with the separate quadrature components, which feed through two separate downconverter mixers before feeding into the two separate feedback-signal combiners on the main path; and wherein the feedforward path includes separate paths for the two inputs $X_I$ and $X_Q$ that feed through two separate upconverter mixers before being combined into a single feedforward signal that feeds into the feedforward-signal combiner.

5. The error-feedback transmitter of claim 1, further comprising:
  a low-pass filter for the main signal, which is located on the main path between the feedback-signal combiner and the upconverter for the main signal;
  a low-pass filter for the feedback signal, which is located on the feedback path between the feedback-signal combiner and a driver for the feedback signal; and
  a low-pass filter for the feedforward signal, which is located on the feedforward path between the input and the upconverter for the feedforward signal.

6. The error-feedback transmitter of claim 1, further comprising an attenuator, which is located on the feedback path between the output and the feedforward-signal combiner, and which has an attenuation parameter α.

7. The error-feedback transmitter of claim 1, further comprising an antenna coupled to the output.

8. The error-feedback transmitter of claim 1, wherein the feedforward-signal combiner comprises a passive wideband interferometer.

9. A method for transmitting a signal, comprising:
  receiving an input signal at an input of a transmitter;
  routing the input signal through a main path, which carries a main signal from the input through a transmitter amplifier to an output of the transmitter that produces an output signal;
  routing a feedback signal from the output through a feedback path, which carries the feedback signal back to the input;
  using a feedback-signal combiner, which is located on the main path between the input and the transmitter amplifier, to negatively combine the feedback signal with the input signal to improve linearity in the output signal;
  routing a feedforward signal from the input through a feedforward path, which carries the feedforward signal toward the output; and
  using a feedforward-signal combiner, which is located on the feedback path between the output and the feedback-signal combiner, to negatively combine the feedforward signal with the feedback signal to suppress components of the main signal in the feedback signal;
  wherein the input signal is a baseband signal and the output signal is a modulated signal;
  wherein the main path includes an upconverter mixer for the main signal, which is located on the main path between the feedback-signal combiner and the transmitter amplifier;
  wherein the feedback path includes a downconverter mixer for the feedback signal, which is located on the feedback path between the feedforward signal combiner and the feedback-signal combiner; and
  wherein the feedforward path includes an upconverter mixer for the feedforward signal, which is located on the feedforward path between the input and the feedforward-signal combiner.

10. The method of claim 9, wherein the feedforward-signal combiner and the feedforward path are designed so that when the feedback and feedforward signals are combined, the feedback and feedforward signals are out of phase and have similar magnitudes, whereby the components of the main signal are substantially eliminated from the feedback signal.

11. The method of claim 9, wherein the input signal is a modulated signal and the output signal is also a modulated signal.

12. The method of claim 9,
  wherein the input comprises two inputs $X_I$ and $X_Q$ that carry separate quadrature components for a quadrature amplitude modulation (QAM) encoding scheme;
  wherein the main path includes separate paths for the two inputs $X_I$ and $X_Q$ that feed through two separate feedback-signal combiners and two separate upconverter mixers before being combined into a single input signal that passes through the transmitter amplifier;
  wherein the feedback path splits after the feedforward-signal combiner to form two separate feedback paths associated with the separate quadrature components, which feed through two separate downconverter mixers before feeding into the two separate feedback-signal combiners on the main path; and
  wherein the feedforward path includes separate paths for the two inputs $X_I$ and $X_Q$ that feed through two separate upconverter mixers before being combined into a single feedforward signal that feeds into the feedforward-signal combiner.

13. The method of claim 9,
  wherein the main path includes a low-pass filter for the main signal, which is located on the main path between the feedback-signal combiner and the upconverter for the main signal;
  wherein the feedback path includes a low-pass filter for the feedback signal, which is located on the feedback path between the feedback-signal combiner and a driver for the feedback signal; and
  wherein the feedforward path includes a low-pass filter for the feedforward signal, which is located on the feedforward path between the input and the upconverter for the feedforward signal.

14. The method of claim 9, further comprising using an attenuator, which is located on the feedback path between the output and the feedforward-signal combiner, to attenuate the feedback signal, wherein the attenuator has an attenuation parameter α.

15. The method of claim 9, further comprising routing the output signal to an antenna.

16. The transmitter of claim 9, wherein the feedforward-signal combiner comprises a passive wideband interferometer.

17. A wireless device, comprising:
  an electronic device;
  a wireless transceiver coupled to the electronic device; and
  an antenna coupled to the wireless transceiver;
  wherein the wireless transceiver includes a transmitter and a receiver; and
  wherein the transmitter comprises:
    an input that receives an input signal from the electronic device;
    an output that produces an output signal, which is directed to the antenna;
    an amplifier, which is located between the input and the output;
    a main path that carries a main signal from the input through the amplifier to the output;
    a feedback path that carries a feedback signal from the output back to the input;
    a feedback-signal combiner, which is located on the main path between the input and the amplifier, and which negatively combines the feedback signal with the input signal to improve linearity in the output signal;
a feedforward path that carries a feedforward signal from the input toward the output; and
a feedforward-signal combiner, which is located on the feedback path between the output and the feedback-signal combiner, and which negatively combines the feedforward signal with the feedback signal to suppress components of the main signal in the feedback signal;

wherein the input signal is a baseband signal and the output signal is a modulated signal; and wherein the transmitter further comprises:
an upconverter mixer for the main signal, which is located on the main path between the feedback-signal combiner and the amplifier;
a downconverter mixer for the feedback signal, which is located on the feedback path between the feedforward signal combiner and the feedback-signal combiner; and
an upconverter mixer for the feedforward signal, which is located on the feedforward path between the input and the feedforward-signal combiner.

18. The wireless device of claim 17, wherein the input signal is a modulated signal and the output signal is also a modulated signal.

19. The wireless device of claim 17,
wherein the input comprises two inputs $X_I$ and $X_Q$ that carry separate quadrature components for a quadrature amplitude modulation (QAM) encoding scheme;
wherein the main path includes separate paths for the two inputs $X_I$ and $X_Q$ that feed through two separate feedback-signal combiners and two separate upconverter mixers before being combined into a single input signal that passes through the amplifier;
wherein the feedback path splits after the feedforward-signal combiner to form two separate feedback paths associated with the separate quadrature components, which feed through two separate downconverter mixers before feeding into the two separate feedback-signal combiners on the main path; and
wherein the feedforward path includes separate paths for the two inputs $X_I$ and $X_Q$ that feed through two separate upconverter mixers before being combined into a single feedforward signal that feeds into the feedforward-signal combiner.

20. The wireless device of claim 17, wherein the feedforward-signal combiner comprises a passive wideband interferometer.

* * * * *